United States Patent
Hwang et al.

(10) Patent No.: US 8,987,034 B2
(45) Date of Patent: Mar. 24, 2015

(54) BACKSIDE ILLUMINATION CMOS IMAGE SENSOR AND METHOD OF MANUFACTURING THE SAME

(71) Applicant: Dongbu Hitek Co., Ltd., Seoul (KR)

(72) Inventors: Jong Taek Hwang, Seoul (KR); Han Choon Lee, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 13/740,904

(22) Filed: Jan. 14, 2013

(65) Prior Publication Data

US 2013/0320472 A1 Dec. 5, 2013

(30) Foreign Application Priority Data

Jun. 5, 2012 (KR) .................. 10-2012-0060245

(51) Int. Cl.
*H01L 21/00* (2006.01)
*H01L 27/146* (2006.01)

(52) U.S. Cl.
CPC ...... *H01L 27/14683* (2013.01); *H01L 27/1464* (2013.01); *H01L 27/14634* (2013.01); *H01L 27/14632* (2013.01); *H01L 27/14636* (2013.01); *H01L 27/14687* (2013.01)
USPC .................. 438/59; 257/E21.575

(58) Field of Classification Search
CPC .................. H01L 27/14636; H01L 27/14634
USPC .................. 438/59; 257/E21.575
See application file for complete search history.

(56) References Cited

U.S. PATENT DOCUMENTS

2006/0043438 A1* 3/2006 Holm et al. .................. 257/291
2010/0207226 A1 8/2010 Park et al.

FOREIGN PATENT DOCUMENTS

KR 10-2008-0008697 1/2008
KR 10-2010-0093367 8/2010
KR 10-2011-0037481 4/2011

* cited by examiner

*Primary Examiner* — Amar Movva
(74) *Attorney, Agent, or Firm* — Andrew D. Fortney; Central California IP Group, P.C.

(57) ABSTRACT

A method of manufacturing a backside illumination image sensor includes forming an epitaxial layer on a silicon (Si) substrate, and forming an inter-metal dielectric (IMD) on the epitaxial layer. The method includes forming a trench in one side region of the epitaxial layer, forming an insulating layer at a side wall and bottom of the trench, forming a color filter and microlens on the IMD, bonding a support wafer onto the IMD with the color filter and microlens formed therein, and/or removing the Si substrate.

20 Claims, 11 Drawing Sheets

BACKSIDE ILLUMINATION CMOS IMAGE SENSOR AND METHOD OF MANUFACTURING THE SAME

The present application claims priority under 35 U.S.C. 119 and 35 U.S.C. 365 to Korean Patent Application No. 10-2012-0060245 (filed on Jun. 5, 2012), which is hereby incorporated by reference in its entirety.

BACKGROUND

Backside illumination image sensors are devices in which a microlens and photodiode may be formed at a backside of a wafer, which may maximize illumination efficiency in some applications. In some frontside illumination image sensors, maximization of illumination efficiency may help overcome limitations in maximizing resolution and sensitivity degradation caused by metal lines.

Figure 1A:
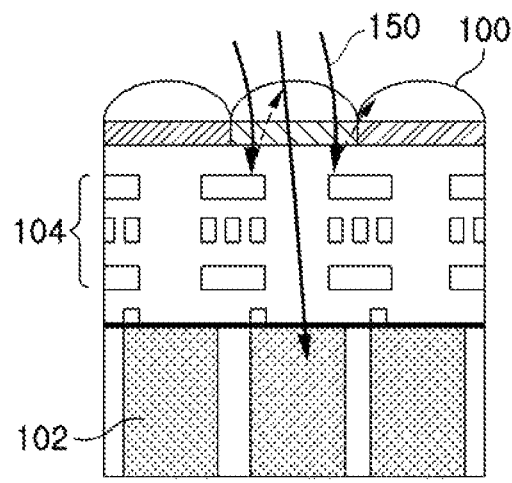
Figure 1B:
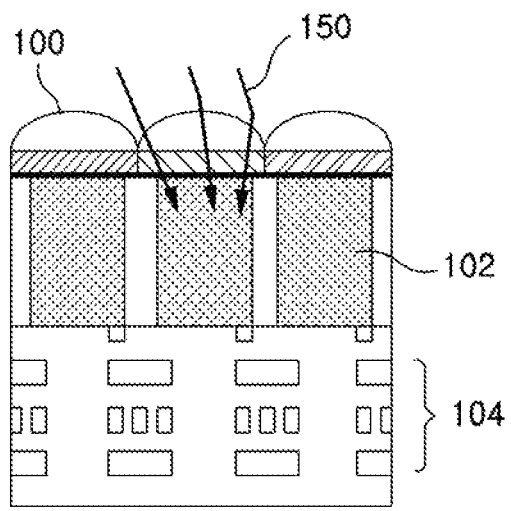

Example FIGS. 1A and 1B illustrate sectional views of a frontside illumination image sensor and a backside illumination image sensor, respectively, in accordance with the related art. In the frontside illumination image sensor illustrated in FIG. 1A, a microlens 100 may be formed at a frontside of a wafer. Accordingly, light 150 passing through the microlens 100 may not be efficiently transferred to a photodiode 102 due to a metal interconnection 104, due to the photodiode 102 being disposed under the metal interconnection 104.

In the backside illumination image sensor illustrated in FIG. 1B, a microlens 100 may be formed at a backside of a wafer. Accordingly, light 150 that passes through the microlens 100 may be directly received by a photodiode 102, which may enhance light illumination efficiency.

Figure 2A:
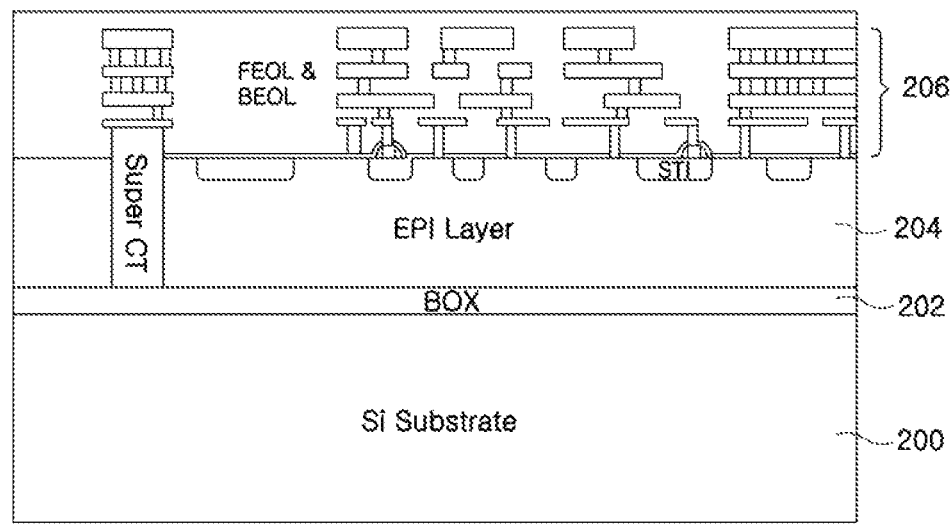
Figure 2B:
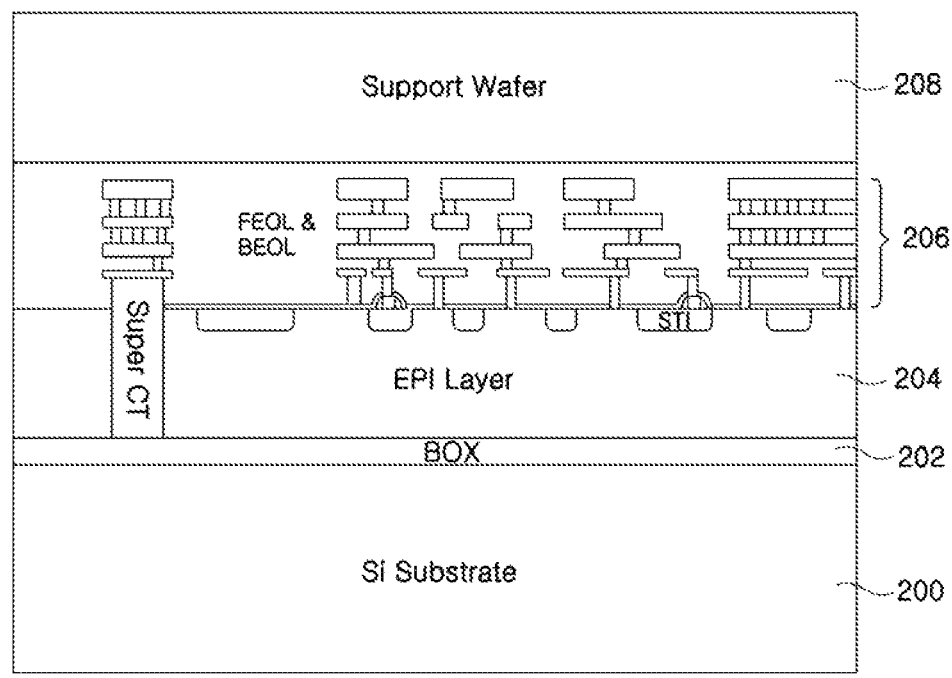
Figure 2C:
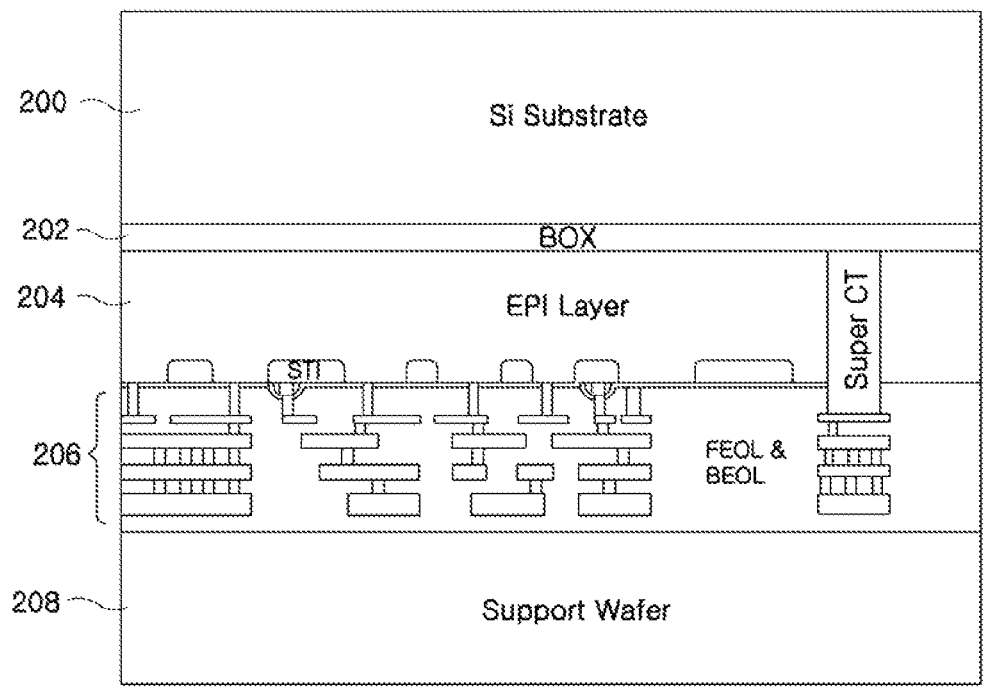
Figure 2D:
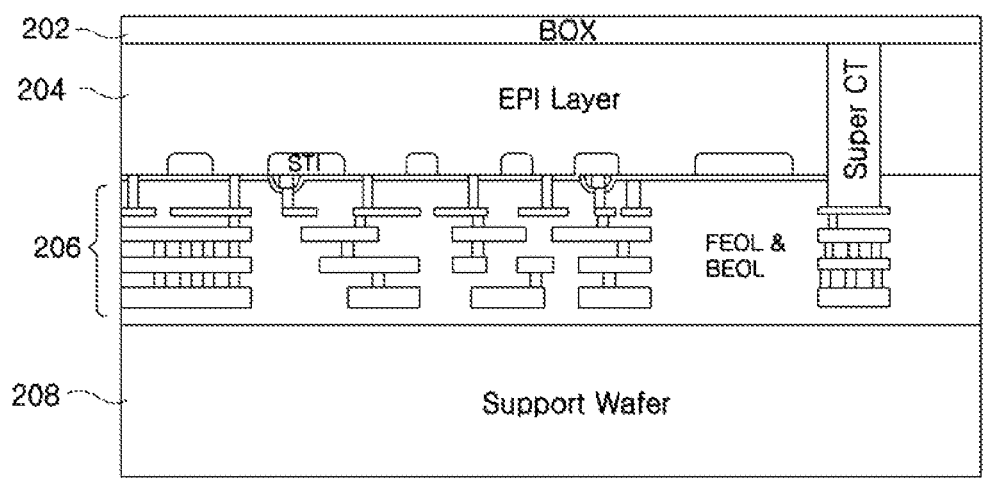

Example FIGS. 2A to 2F illustrate sectional views of a process of manufacturing a backside illumination image sensor using an SOI wafer, in accordance with the related art. As illustrated in FIG. 2A, a metal interconnection 206 for an image sensor may be formed on an epitaxial layer 204 by performing a CIS process using an SOI wafer. As illustrated in FIG. 2B, a support wafer 208 may be bonded to an upper end of a wafer in which a CMOS process has been performed for thinning the wafer, through a wafer bonding process. As illustrated in FIG. 2C, the bonded support wafer 208 may be fixed. A grinding and chemical mechanical polishing (CMP) process may be performed on a Si substrate 200 to remove the Si substrate 200, thereby exposing buried oxide (BOX) 202, as illustrated in FIG. 2D.

Figure 2E:
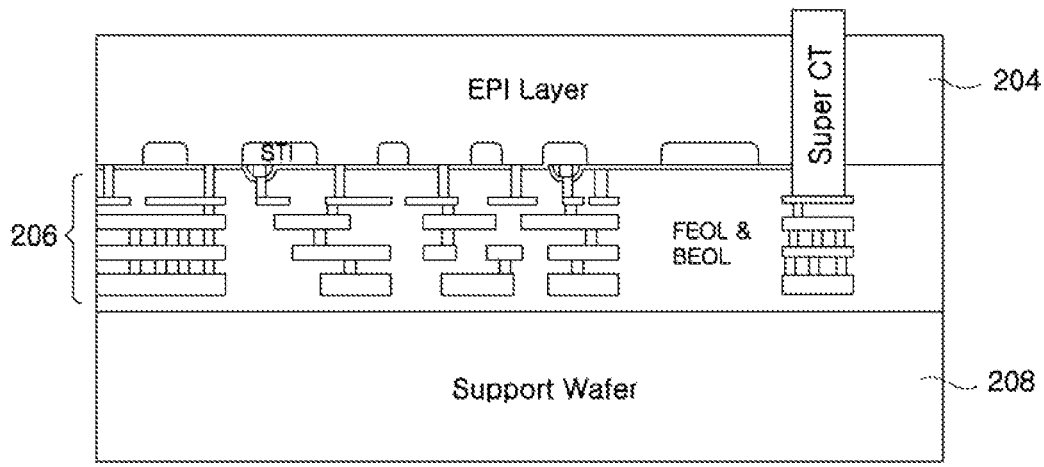
Figure 2F:
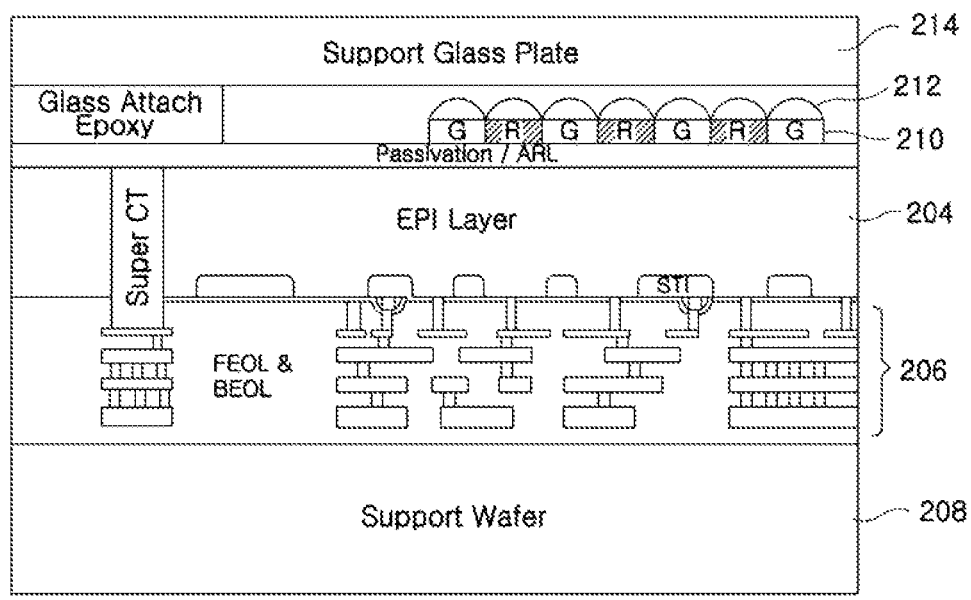

As illustrated in FIG. 2E, the BOX 202 may be removed through wet etching. The epitaxial layer 204 in which a photodiode will be formed may remain. As illustrated in FIG. 2F, a color filter 210, a microlens 212, and a support glass plate 214 may be sequentially formed over the epitaxial layer 204, thereby completing the backside illumination image sensor.

In a process of manufacturing a backside illumination image sensor, Si oxide may be used or required as the etch stop layer for performing a wafer thinning process (e.g. a process that leaves a portion of silicon substantially equal to the thickness of a photodiode on a wafer and removes the other portion of silicon. An oxide layer may be required to be disposed under silicon. An SOI (silicon on insulator) wafer in which a BOX may be disposed between Si layers may be used as a substrate. However, a SOI wafer may be relatively expensive and require a complicated manufacturing process compared to the bulk Si wafer.

SUMMARY

Embodiments relate to a complementary metal-oxide semiconductor (CMOS) image sensor (CIS) and a method of manufacturing the same, which may be a backside illumination image sensor using a bulk silicon (Si) wafer without using a silicon on insulator (SOI) wafer with buried oxide (BOX).

In embodiments, a method of manufacturing a backside illumination image sensor may include at least one of: (1) forming an epitaxial layer on a silicon (Si) substrate; (2) forming an inter-metal dielectric (IMD) layer on the epitaxial layer; (3) forming a trench in one side region of the epitaxial layer; (4) forming an insulating layer at a side wall and bottom of the trench; (5) forming a metal interconnection on the IMD layer; (6) bonding a support wafer onto the IMD layer with the metal interconnection formed therein; and (7) removing the Si substrate.

In embodiments, the removing the Si substrate may include etching the Si substrate with the trench as an etch stop layer to remove the Si substrate. In embodiments, the forming of the trench may include at least one of: (1) etching the IMD layer and the epitaxial layer for the Si substrate to be exposed; (2) forming the insulating layer at the bottom and side wall of the trench; and (3) forming a conductive layer inside the trench.

In embodiments, the forming of the conductive layer may include at least one of: (1) forming a barrier metal at the bottom and side wall of the trench; and (2) burying the inside of the trench, in which the barrier metal is formed, with conductive materials. In embodiments, the conductive layer includes tungsten (W). In embodiments, forming the insulating layer may include at least one of: (1) forming Si oxide at the bottom and side wall of the trench; and (2) injecting nitrogen ion into the Si oxide, which is formed at the bottom and side wall of the trench, to nitrify the Si oxide.

In embodiments, the Si oxide may be formed with nitride by injecting the nitrogen ion into the Si oxide and performing an annealing process. In embodiments, the Si oxide may be formed to have a thickness of between approximately 1000 Å to 3000 Å. In embodiments, the trench may be a super contact trench which connects a pad and the metal interconnection. In embodiments, the trench may be formed as one or more trenches In embodiments, a backside illumination image sensor may include at least one of: (1) an epitaxial layer formed on a Si substrate; (2) an inter-metal dielectric (IMD) layer formed on the epitaxial layer; (3) a super contact trench formed in one side region of the epitaxial layer; (4) an insulating layer formed at a side wall of the super contact trench; (5) a metal interconnection formed on the IMD layer; and (6) a color filter and a microlens sequentially formed over the IMD layer.

DRAWINGS

The above and other objects and features of embodiments will become apparent from the following description of embodiments, given in conjunction with the accompanying drawings, in which:

Example FIGS. 1A and 1B are respective sectional views of a frontside illumination image sensor and a backside illumination image sensor, in accordance with the related art.

Example FIGS. 2A to 2F are sectional views of a process of manufacturing a backside illumination image sensor, in accordance with the related art.

Example FIGS. 3A to 3G are sectional views of a process of manufacturing a backside illumination image sensor, in accordance with embodiments.

Example FIGS. 4A to 4F are sectional views of a process of manufacturing a super contact etch stop layer on the backside illumination image sensor, in accordance with embodiments.

DESCRIPTION

The advantages and features of embodiments and methods of accomplishing these will be clearly understood from the following description taken in conjunction with the accompanying drawings. Embodiments are not limited to those embodiments described, as embodiments may be implemented in various forms. It should be noted that embodiments are provided to make a full disclosure and also to allow those skilled in the art to know the full range of the embodiments. Therefore, the embodiments are to be defined only by the scope of the appended claims.

Figure 3A:
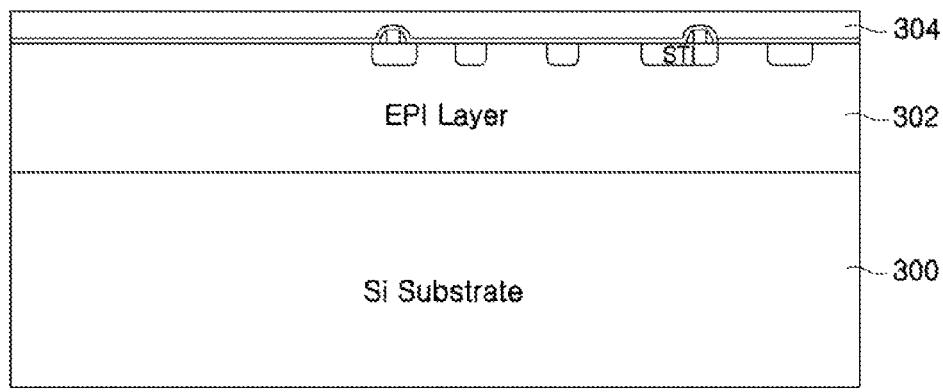
Figure 3B:
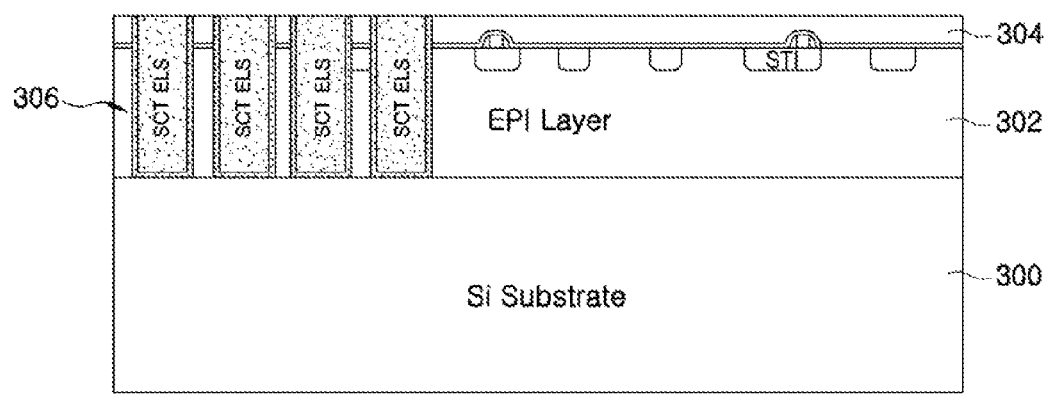

Example FIGS. 3A to 3G illustrate sectional views of a process of manufacturing a backside illumination image sensor using a bulk Si wafer, in accordance with embodiments. As illustrated in FIG. 3A, an epitaxial layer 302 may be formed on a Si substrate 300, and an IMD (inter metal dielectric) layer 304 may be formed on the epitaxial layer 302, in accordance with embodiments. As illustrated in FIG. 3B, a super contact etch stop layer 306 may be formed to have a thickness approximately equal to that of the epitaxial layer 302, in accordance with embodiments. In embodiments, in the backside illumination image sensor, a Si etch stop layer such as Si nitride may be formed inside a trench for forming a super contact. The super contact etch stop layer 306 may be used as an etch stop layer to the epitaxial layer 302 in performing a wafer thinning process.

Figure 3C:
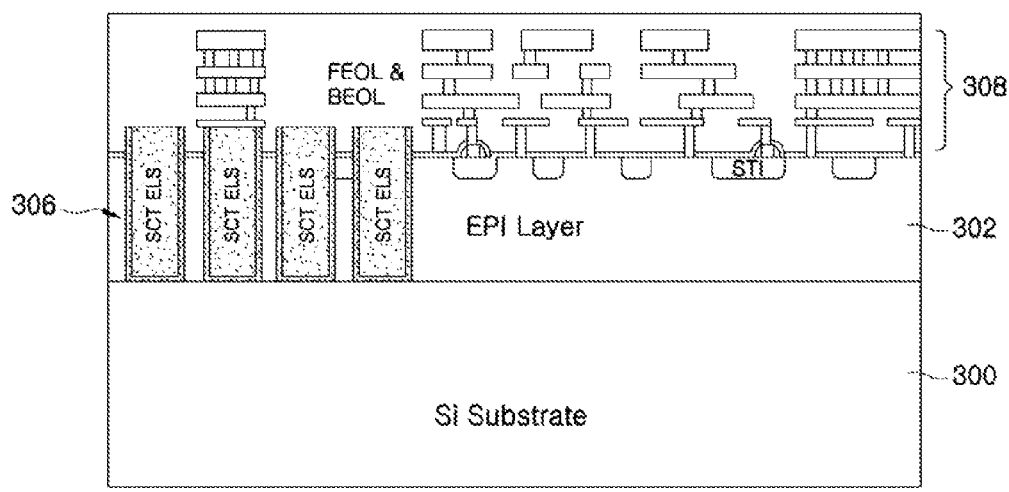
Figure 3D:
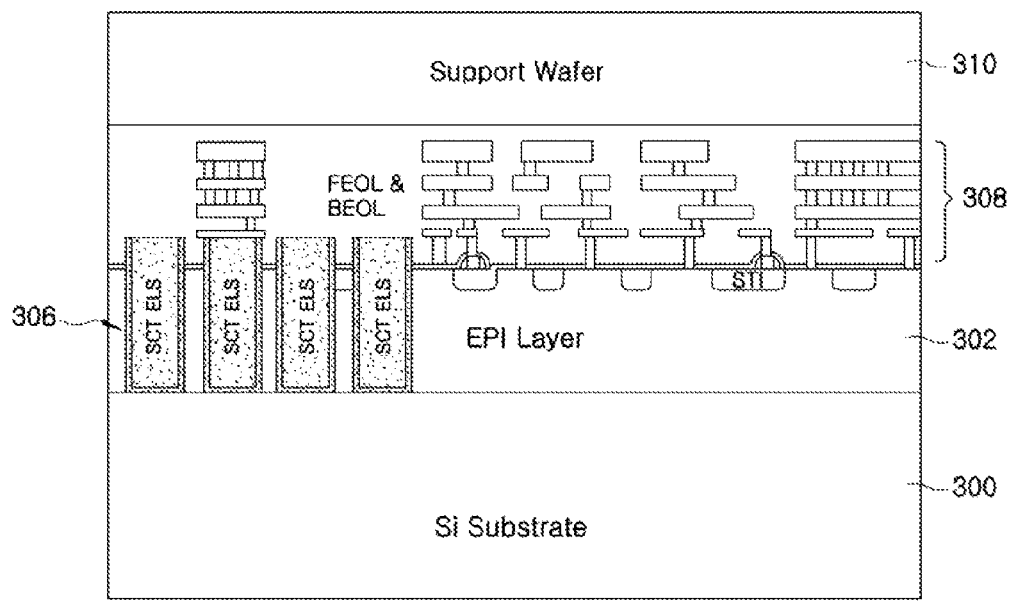
Figure 3E:
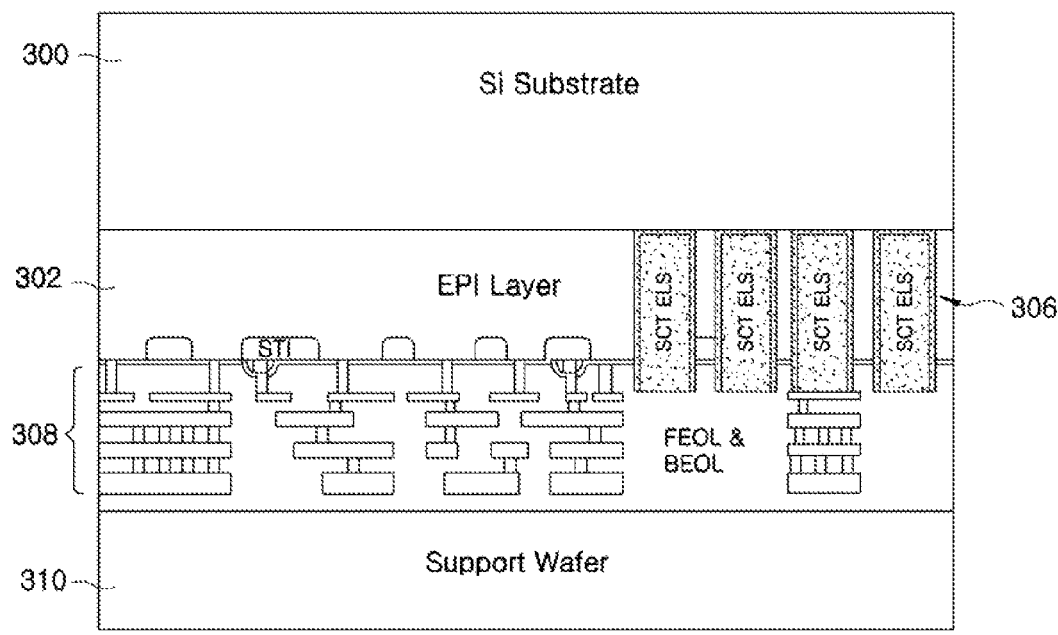
Figure 3F:
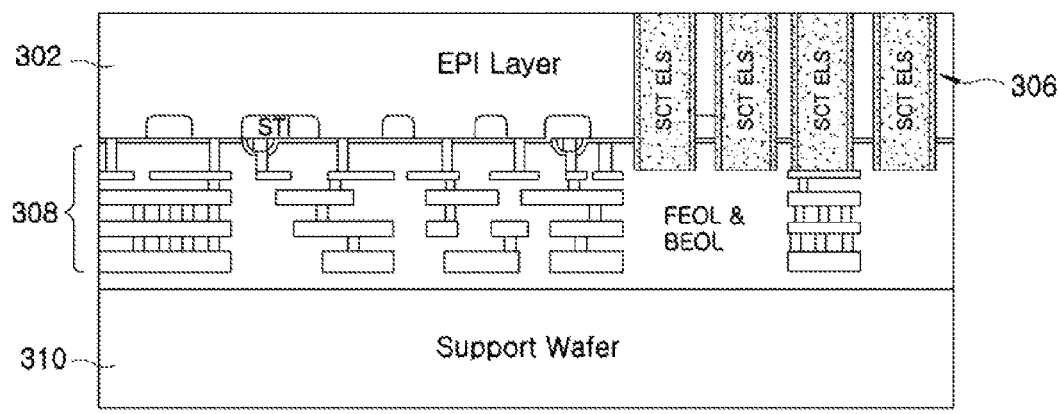

As illustrated in FIG. 3C, by performing a subsequent CMOS process, a metal interconnection 308 may be finished on the epitaxial layer 302, in accordance with embodiments. As illustrated in FIG. 3D, a support wafer 310 may be bonded to an upper end of a wafer in which a CMOS process has been performed for thinning the wafer, through a wafer bonding process, in accordance with embodiments. As illustrated in FIG. 3E, the bonded support wafer 310 may be fixed, and a grinding and CMP process may be performed on a Si substrate 300, in accordance with embodiments. As illustrated in FIG. 3F, the Si substrate 300 may then be removed from the epitaxial layer 302, thereby exposing BOX 302, in accordance with embodiments.

Figure 3G:
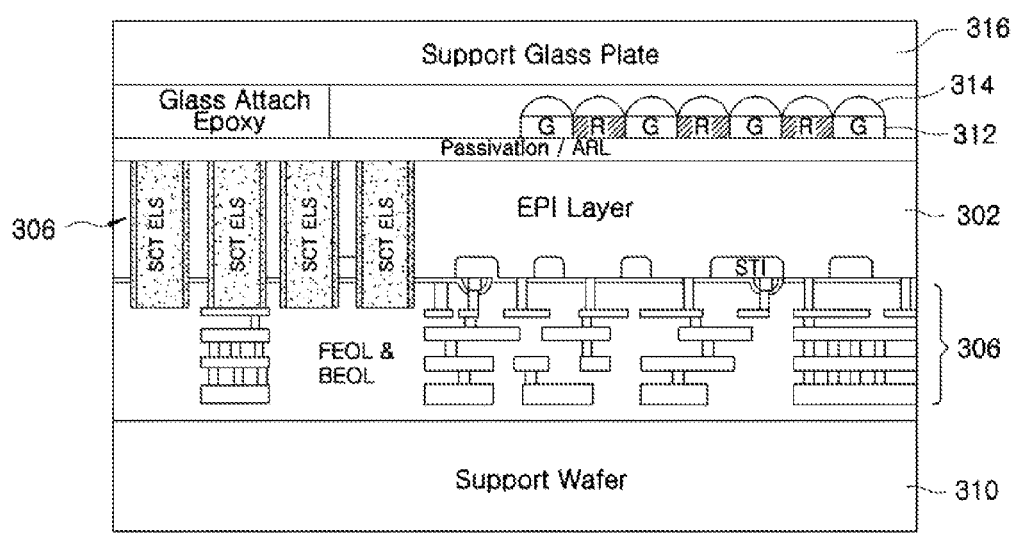

During the grinding and CMP process that has been performed on the Si substrate 300, the Si substrate 300 may be etched by using a selectivity between the super contact etch stop layer 306 formed in FIG. 3B and a Si layer. Accordingly, as illustrated in FIG. 3F, accurate etching of the Si layer to the epitaxial layer 302 may be enabled, in accordance with embodiments. In embodiments, the etching process on the Si substrate 300 that may be performed to the epitaxial layer 302 may etch the IMD layer that may be formed at a bottom of the super contact etch stop layer 306. In embodiments, as illustrated in FIG. 3G, a color filter 312, a microlens 314, and a support glass plate 316 are sequentially formed over the epitaxial layer 302, thereby finishing the backside illumination image sensor.

Example FIGS. 4A to 4F illustrate sectional views of a process of manufacturing the super contact etch stop layer, in accordance with embodiments. A process of manufacturing the super contact etch stop layer, in accordance with embodiments, is described with reference to FIGS. 4A to 4F.

Figure 4A:
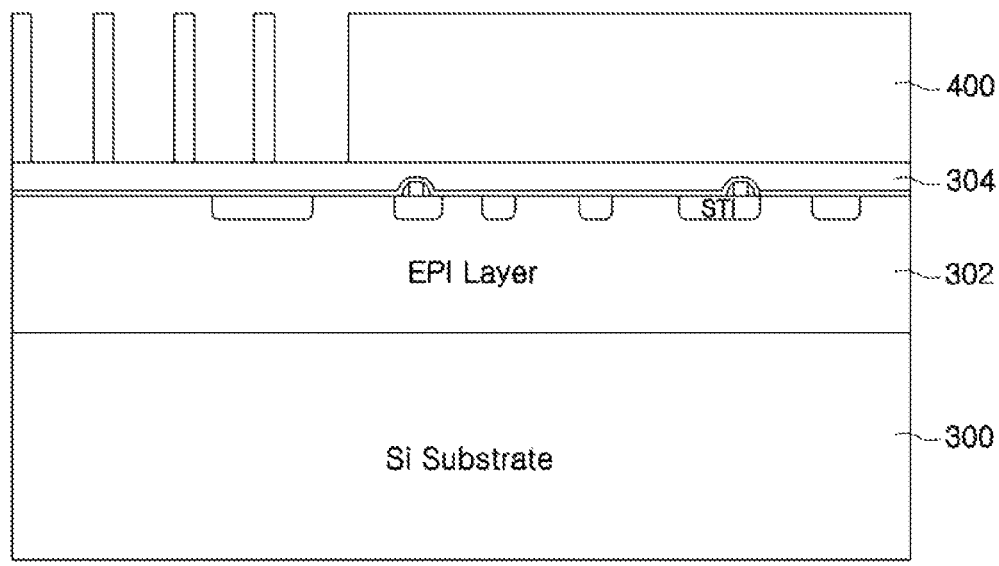

As illustrated in FIG. 4A, the epitaxial layer 302 on which a photodiode will be formed may be formed on the Si substrate 300. The IMD layer 304 may then be formed on the epitaxial layer 302. A photoresist may be coated on the IMD layer 304. The photoresist may be patterned through a photolithography process to form a photoresist mask 400 for trench etching in a region in which a super contact will be formed.

Figure 4B:
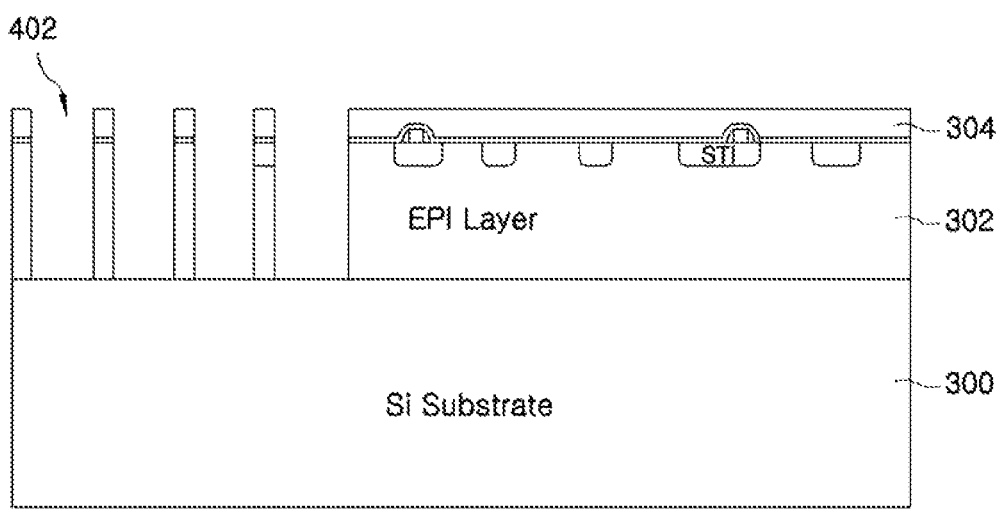

As illustrated in FIG. 4B, in the region in which the super contact will be formed, the IMD layer 304 and the epitaxial layer 302 may be sequentially etched using the photoresist mask 400 in order for the Si substrate 300 to be exposed, thereby forming a trench 402 that may be used for forming the super contact, in accordance with embodiments.

Figure 4C:
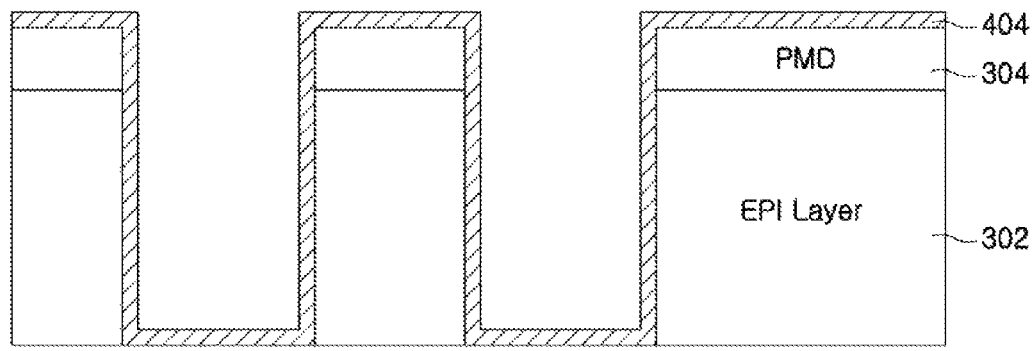

As illustrated in FIG. 4C, Si oxide 404 may be formed at a surface of a wafer including the inside of the trench 402 that may be used for forming the super contact, in accordance with embodiments. In this case, the Si oxide 404 may be formed to have a thickness between approximately 1000 Å to 3000 Å by a PE-CVD process.

Figure 4D:
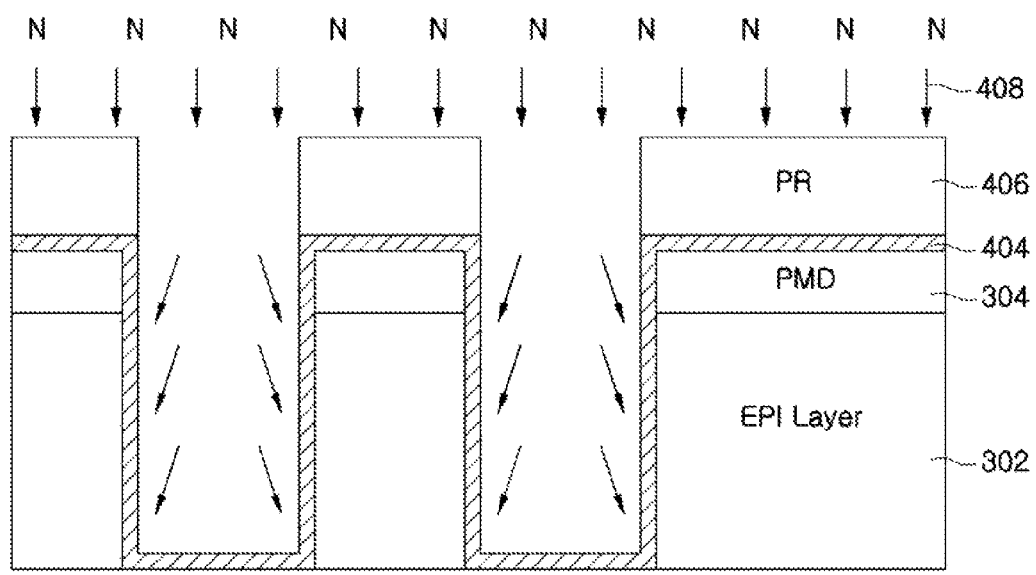
Figure 4E:
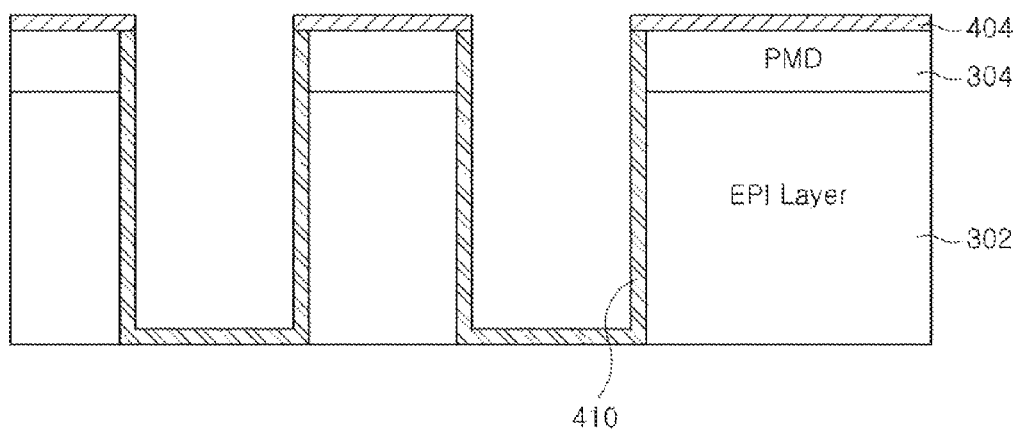

In embodiments, as illustrated in FIG. 4D, the photoresist may be coated on the surface of the wafer. Then by patterning the photoresist through the photolithography process, a photoresist mask 406 may be formed in order for only the trench 402 of the super contact to be opened. In embodiments, a process 408 which injects nitrogen ion into the trench 402 of the super contact may be performed with the photoresist mask 406. In embodiments, the nitrogen ion injecting process 408 may require conditions in which energy may be between approximately 10 KeV to 50 KeV and dose may be about $2\,e^{12}$ atom/cm$^2$ to $5\,e^{14}$ atom/cm$^2$ As illustrated in FIG. 4E, the photoresist mask 406 may be removed. By performing an annealing process, the nitration of the Si oxide 404 may be finished, thereby forming nitride 410 inside the trench 402 of the super contact, in accordance with embodiments. In embodiments, rapid thermal process (RTP) equipment may perform the annealing process under process conditions in which a temperature may be between approximately 900° C. to 12,000° C., an atmosphere may be $N_2$ gas, and/or a duration may be between approximately 5 sec to 30 sec.

Figure 4F:
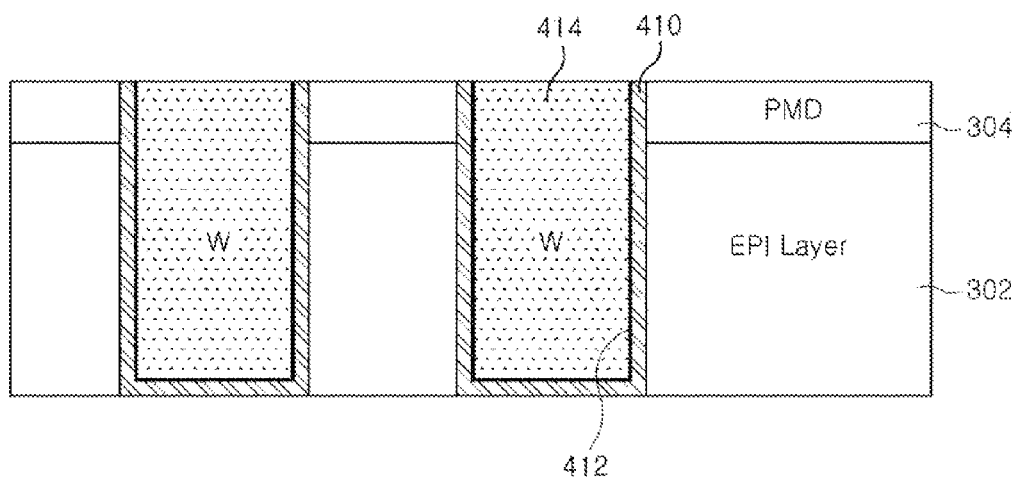

As illustrated in FIG. 4F, a barrier metal 412 such as titanium/titanium nitride (Ti/TiN) may be formed inside the trench 402 of the super contact, for the electrical connection of the super contact, in accordance with embodiments. The inside of the trench 402 may be buried (e.g. gap-fill) with conductive materials such as tungsten (W) (in embodiments). A W plug 414 may then be formed by performing a CMP process, in accordance with embodiments.

In embodiments, the Si layer and the nitride having a high etch selectivity may be formed inside the super contact. In embodiments, the Si layer and the nitride may be used as the etch stop layer in performing the wafer thinning process. Accordingly, the backside illumination image sensor may be manufactured by using the bulk Si wafer without using the expensive SOI wafer, in accordance with embodiments.

In embodiments, a method of manufacturing a backside illumination image sensor forms an insulating layer (e.g. such as a Si layer and nitride having a high etch selectivity) inside the trench in which the super contact will be formed. Accordingly, in embodiments, when forming a super contact in a backside illumination image sensor the insulating layer may be configured to act as the etch stop layer in the etching process on the backside of the wafer for forming the photodiode. In accordance with embodiments, effective manufacturing of a backside illumination image sensor using a bulk Si wafer without using the SOI wafer with BOX may be accomplished.

While embodiments have been shown and described, it will be understood by those skilled in the art that various changes and modification may be made without departing the scope of the embodiments as defined the following claims.

What is claimed is:

1. A method comprising:
   forming an epitaxial layer at least one of on or over a silicon (Si) substrate;
   forming an inter-metal dielectric (IMD) layer at least one of on or over the epitaxial layer;
   forming a trench at one side region of the epitaxial layer by etching the IMD layer and the epitaxial layer to expose the Si substrate, forming an insulating layer at least one of on or over a side wall and bottom of the trench, and forming a conductive layer inside the trench;
   forming a metal interconnection at least one of on or over the IMD layer; and
   bonding a support wafer onto the IMD layer with the metal interconnection formed therein; and
   removing the Si substrate.

2. The method of claim 1, wherein the method is a method of manufacturing a backside illumination image sensor.

3. The method of claim 1, wherein removing the Si substrate comprises etching the Si substrate using the trench as an etch stop layer.

4. The method of claim 1, wherein forming the conductive layer comprises:
   forming a barrier metal at least one of on or over the bottom and side wall of the trench; and
   filling the trench, in which the barrier metal is formed, with a conductive material.

5. The method of claim 4, wherein the conductive layer comprises tungsten (W).

6. The method of claim 1, wherein forming the insulating layer comprises:
   forming an Si oxide at least one of on or over the bottom and side wall of the trench; and
   injecting nitrogen ions into the Si oxide to nitrify the Si oxide.

7. The method of claim 6, further comprising annealing the Si oxide after injecting the nitrogen ions into the Si oxide.

8. The method of claim 7, wherein the Si oxide is annealed by a rapid thermal process at a temperature between approximately 900° C. to 1200° C. in an $N_2$ atmosphere for between approximately 5 sec to 30 sec.

9. The method of claim 6, wherein the Si oxide has a thickness between approximately 1000 Å to 3000 Å.

10. The method of claim 6, wherein the nitrogen ions are injected into the Si oxide at an energy of approximately 10 KeV to 50 KeV and in a dose of about $2 \times 10^{12}$ atom/cm$^2$ to $5 \times 10^{14}$ atom/cm$^2$.

11. The method of claim 6, wherein removing the Si substrate comprises etching the Si substrate using the nitrified Si oxide as an etch stop layer.

12. The method of claim 1, wherein the trench connects a pad and the metal interconnection.

13. The method of claim 12, wherein the trench is a super contact trench.

14. The method of claim 1, wherein the trench comprises multiple trenches.

15. The method of claim 1, further comprising sequentially forming a color filter and a microlens over the IMD layer.

16. The method of claim 15, further comprising, after forming the color filter and the microlens, forming a support glass plate over the epitaxial layer.

17. The method of claim 1, wherein removing the Si substrate comprises grinding and/or chemical-mechanical polishing the Si substrate.

18. The method of claim 1, wherein forming the metal interconnection comprises a CMOS process.

19. The method of claim 1, wherein forming the trench comprises coating the IMD layer with a photoresist, patterning the photoresist using a photolithography process to form a photoresist mask, and etching the trench.

20. The method of claim 1, wherein the epitaxial layer is an Si layer.

* * * * *